United States Patent [19]

Davis

[11] 3,846,705

[45] Nov. 5, 1974

[54] PULSE AMPLITUDE MODULATED SIGNAL GENERATOR

[75] Inventor: William W. Davis, Minneapolis, Minn.

[73] Assignee: Sperry Rand Corporation, New York, N.Y.

[22] Filed: Aug. 16, 1973

[21] Appl. No.: 388,869

[52] U.S. Cl. .............................. 325/141, 332/9 T

[51] Int. Cl. .............................. H04l 27/04

[58] Field of Search ........... 325/141, 143, 145, 163; 178/66 R, 66 A, 68; 307/264; 331/182; 332/9 R, 9 T, 317; 340/345 R, 355

[56] References Cited

UNITED STATES PATENTS

| | | | |
|---|---|---|---|
| 3,626,417 | 12/1971 | Gilbert | 332/17 X |
| 3,803,354 | 4/1974 | Bennett | 178/66 R |

*Primary Examiner*—Benedict V. Safourek
*Attorney, Agent, or Firm*—Kenneth T. Grace; Thomas J. Nikolai; John P. Dority

[57] ABSTRACT

A circuit that performs the oscillator, buffer and modulator functions of a pulse amplitude modulated (PAM) transmitter is described. The circuit includes three NOR gates: a first NOR gate that is feedback-coupled to function as an oscillator-generator of a binary oscillator signal; a second NOR gate that buffers the oscillator signal to provide a buffered signal that is stabilized in both amplitude and phase shift; and, a third NOR gate having a first input that is the buffered signal and a second input that is a binary pulse signal that pulse-amplitude-modulates the buffered signal.

4 Claims, 2 Drawing Figures

PULSE AMPLITUDE MODULATED SIGNAL GENERATOR

BACKGROUND OF THE INVENTION

The functions of oscillator, buffer and modulator have conventionally been performed using discrete element vacuum tubes or semiconductor devices such as transistors or diodes. The subject invention makes use of a single integrated circuit for performing all of the active element functions, and takes advantage of the very good high frequency response and the known and predictable behavior of the device. Also the more conventional means of modulation, namely variation of the supply voltage on the final amplifier, is not suited to the very low output voltage swings encountered in this circuit, and is replaced by a kind of nonlinear summing of the unmodulated and 100 percent modulated outputs.

SUMMARY OF THE INVENTION

The present invention utilizes a MECL flat pack (Motorola MC1662S) to provide the active circuits for the oscillator, buffer and modulator functions of a PAM transmitter used in the IO channel of a data processing system. The circuit utilizes three two-input emitter-coupled-logic (ECL) NOR gates. A first NOR gate has its output coupled back to its common coupled two inputs through an inductance such two inputs are, in turn, common coupled to ground through a capacitance for forming a free running oscillator. The oscillator signal from the output of the first NOR gate is common coupled to the two inputs of the second NOR gate the output of which is a buffered signal that is stabilized in both amplitude and phase shift to preclude the frequency modulation of the oscillator signal. The buffered signal is then coupled as a first input to the third NOR gate while the second input to the third NOR gate is a binary pulse signal whose pulse duration is a substantial number of multiples of that of the pulse duration of the buffered signal. The output of the third NOR gate is, in turn, coupled through a resistor to the first input such that the binary pulse signal on the second input pulse-amplitude-modulates the buffered signal on the first input producing as an output therefrom a pulse amplitude modulated signal whose carrier frequency is that of the oscillator signal but whose pulse amplitude is that of the buffered signal or of a decreased amplitude, depending on the binary level or significance of the binary pulse signal on the second input to the third NOR gate.

DESCRIPTION OF THE PREFERRED EMBODIMENTS

Figure 1:
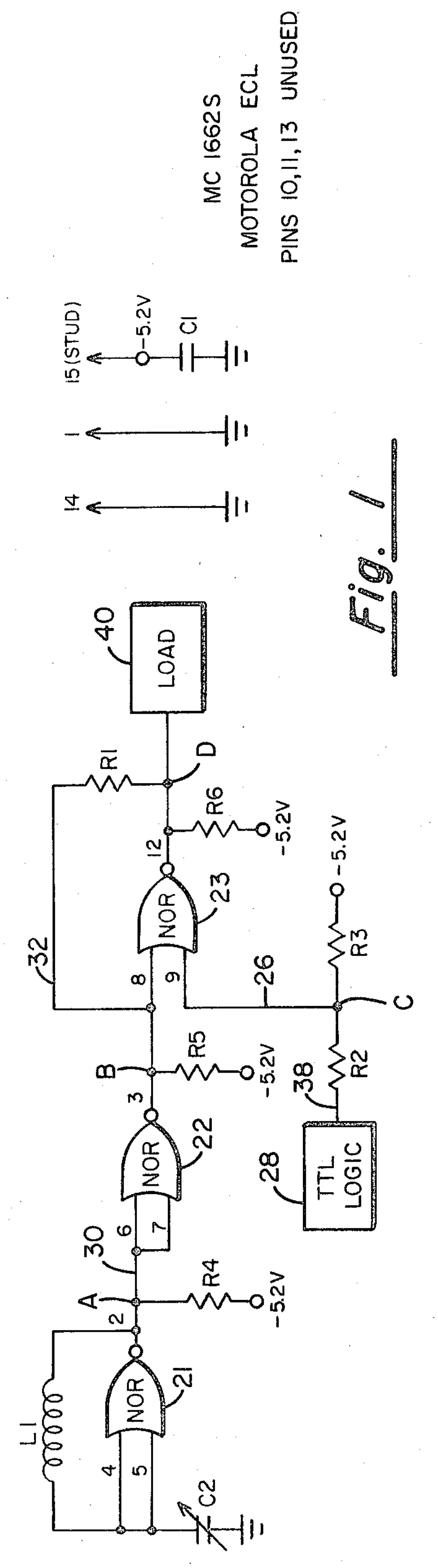
FIG. 1 is a schematic diagram of a preferred embodiment of the present invention.

With particular reference to FIG. 1 there is presented a schematic diagram illustrating the manner in which the three ECL NOR gates 21, 22 and 23 are intercoupled to form the preferred embodiment of the present invention. The common coupled first and second input pins 4 and 5 of NOR gate 21 are coupled to output pin 2 thereof by means of inductor L1 and to ground by means of a variable capacitor C2. With the output pin 2 of NOR gate 21 coupled to a voltage source of −5.2 volts by means of resistor R4, NOR gate 21 is biased into a condition of instability and oscillates at a frequency generally established by the inductance of inductor L1 and the capacitance of capacitor C2. This oscillator signal at node A is coupled to the common coupled two input pins 6 and 7 of NOR gate 22 to produce at its output pin 3 and node B, which is coupled to a voltage source of −5.2 volts by means of resistor R5, a buffered signal. The second NOR gate 22 buffers the output of the first NOR gate 21 to stabilize the amplitude and phase shift of the oscillator signal A as it is inverted at node B. The buffered signal at node B is then coupled to the first input pin 8 of the third NOR gate 23 and to the load 40 and node D and thence to the output pin 12 by means of resistor R1 which output pin 12 is, in turn, coupled to a voltage source of −5.2 volts by means of resistor R6. The second input pin 9 of NOR gate 23 is, by means of line 26, coupled to node C which is intermediate the common coupled ends of resistors R2 and R3 the opposite ends of which are coupled to a source 28 of a binary pulse signal and a voltage source of −5.2volts, respectively.

Figure 2:
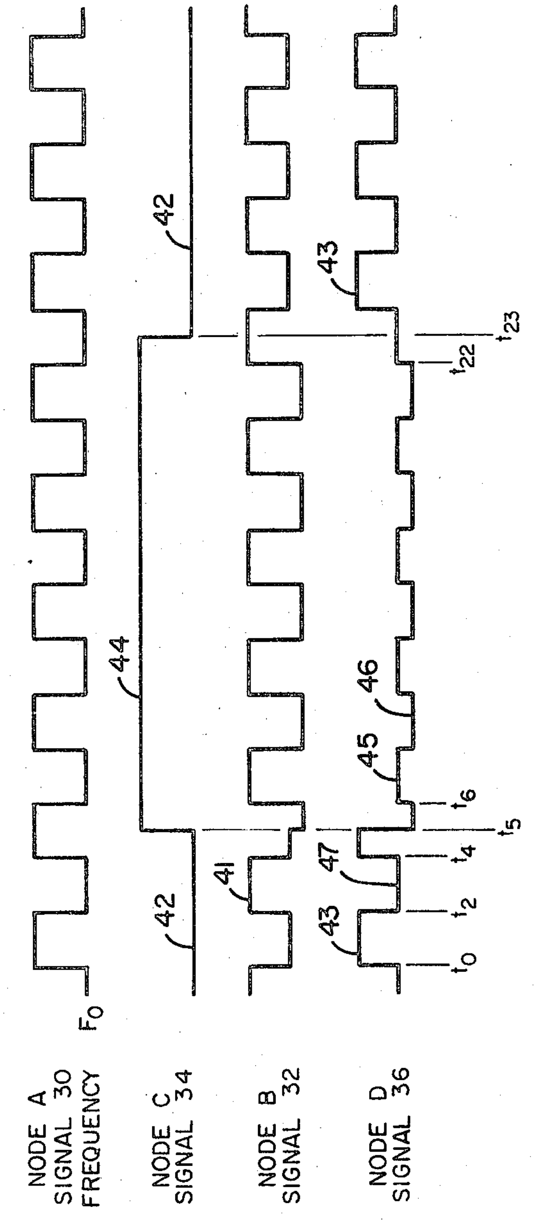
FIG. 2 is an idealized signal waveform, timing diagram associated with the operation of the circuit of FIG. 1.

With particular reference to FIG. 2 there are presented the waveforms of the signals associated with the timing diagram relating to the operation of the circuit of FIG. 1. With NOR gate 21 oscillating at a frequency $F_0$ there is produced at node A the binary pulse oscillator signal 30 of a frequency $F_0$. Signal 30 when passing through NOR gate 22 from node A to node B is inverted to form signal 32 of the same frequency $F_0$ of opposite polarity phase and of an amplitude modulated by source 28. Source 28, which is a transistor-transistor-logic (TTL) source, couples a binary pulse signal to line 38 which through resistors R2, R3 and the voltage source of −5.2 volts produces at node C signal 34 which is a binary pulse signal of a frequency $F_M$, $F_0 = 9F_M$, which through line 26 is coupled to the second input pin 9 of NOR gate 23.

The explanation of the overall circuit behavior centers on the coupling provided by R1, and the modifications of signals at nodes B and D. Since the sources of pin 3 on node B and pin 12 on node D are emitter followers, they can pull up very strongly and raise node B or D to the maximum high level, irrespective of the condition on the other node. On the other hand, they cannot pull down, and the low level assumed at node B or D depends on the voltage appearing on the other end of R1. When both are down, R1 has no effect and nodes B and D both assume their lowest level. With signal 32 coupled to load 40 and node D by means of resistor R1 from node B and to the first input pin 8 of NOR gate 23 and at times $t_0 - t_5$ when signal 34, at node C and at the second input pin 9 of NOR gate 23, is in its low level 42, node D at load 40 sees the signal 36 which is the signal inverted and stabilized at the high amplitude 43 which is determined by the internal parameters of NOR gate 23. The low level 47 of signal 36 is determined by the network of resistors R1 and R6 and the voltage source of −5.2 volts.

Now, if at time $t_5$ source 28 changes the binary level of the signal it is coupling to line 38 such that node C is suddenly increased to its high level 44, the high level 44 of signal 34 at the second input pin 9 of NOR gate 23 turns NOR gate 23 ON such that the resistor network of resistors R1 and R2 and the voltage source of −5.2 volts at the output pin 12 of NOR gate 23 limits the amplitudes of the individual pulses of signal 36 at node D to the high level 45 and the low level 46 shown in FIG. 2. Conversely, when source 28 again couples a signal of the relatively low level 42 to line 38, node C again returns to its relatively low level such that the high amplitude of the individual pulses of signal 36 at node D return to their high level 43. Thus, the relative low level 42, high level 44 of signal 34 at node C determines the relative high, low amplitude of the individual pulses of signal 36 at node D.

In the particular application of the circuit of FIG. 1, source 28 is transistor-transistor-logic requiring the resistor network of resistors R2 and R3 to make source 28 compatible with the emitter-coupled-logic of NOR gate 23. Accordingly, when an emitter-coupled-logic source 28 is utilized the resistor network of resistors R2, R3 need not be utilized and node C would be at line 38. In the configuration of FIG. 1 modulation depth of the signal 36 at node D, i.e., the difference between the peak-to-peak signal amplitudes prior to and following $t_5$ is determined by the resistor value of resistor R1, which resistor value may be varied to provide the desired modulation depth as required within the limits provided by the circuit. The frequency $F_0$ of signals 30, 32 and 36 is limited by the properties of the ECL circuit utilized (Motorla MC1662S) with a limiting frequency being approximately 270 MHz (Megahertz).

The load 40 may alternatively be placed at node B rather than node D, in which case signal 32 rather than signal 36 becomes the circuit output. This is the perferred location for small percentage modulation, with the position at node D being preferred for a larger percentage modulation. When $R1 \longrightarrow \infty$, the modulation depths at node B and node D approach 0 and 100 percent, respectively.

What is claimed is:

1. A pulse amplitude modulated signal generator, comprising:

first, second and third NOR gates, each having first and second inputs and an output;

inductor means coupling the output of said first NOR gate to the common coupled first and second inputs of said first NOR gate;

capacitor means coupling the common coupled first and second inputs of said first NOR gate to a first voltage source;

said first NOR gate coupling an oscillator signal of a frequency $F_0$ to its output;

means coupling the output of said first NOR gate to the common coupled first and second inputs of said second NOR gate;

first resistor means coupling the output of said first NOR gate to a second voltage source;

means coupling the output of said second NOR gate to the first input of said third NOR gate;

second resistor means coupling the output of said second NOR gate to a third voltage source;

said second NOR gate buffering said oscillator signal and coupling a buffered signal to its output;

pulse signal source means;

means coupling said pulse signal source means to the second input of said third NOR gate for coupling a binary pulse signal of a frequency $F_M$ to the second input of said third NOR gate;

third resistor means coupling the first input of said third NOR gate to the output of said third NOR gate;

fourth resistor means coupling the output of said third NOR gate to a fourth voltage source.

2. The signal generator of claim 1 further including load means directly coupled to the output of said third NOR gate.

3. The signal generator of claim 1 in which said means coupling said pulse signal source to the second input of said third NOR gate comprises:

fifth and sixth resistor means serially coupling said pulse signal source to a fifth voltage source;

means coupling the common coupled ends of said fifth and sixth resistor means to the second input of said third NOR gate.

4. The signal generator of claim 1 in which said first voltage source is a source of ground potential and said second, third and fourth voltage sources are a single source of a common voltage.

* * * * *